US009245797B2

(12) United States Patent
Tsai et al.

(10) Patent No.: US 9,245,797 B2
(45) Date of Patent: Jan. 26, 2016

(54) OPENING FILL PROCESS AND STRUCTURE FORMED THEREBY

(71) Applicant: Taiwan Semiconductor Manufacturing Company, Ltd., Hsin-Chu (TW)

(72) Inventors: Chun-I Tsai, Hsin-Chu (TW); Chi-Yuan Chen, Hsin-Chu (TW); Wei-Jung Lin, Taipei (TW); Chia-Han Lai, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/970,088

(22) Filed: Aug. 19, 2013

(65) Prior Publication Data

US 2015/0048511 A1 Feb. 19, 2015

(51) Int. Cl.
*H01L 21/768* (2006.01)
*H01L 23/522* (2006.01)
*H01L 21/28* (2006.01)
*H01L 29/66* (2006.01)
*H01L 23/532* (2006.01)
*H01L 29/51* (2006.01)

(52) U.S. Cl.
CPC .... *H01L 21/76879* (2013.01); *H01L 21/28079* (2013.01); *H01L 29/66545* (2013.01); *H01L 23/5226* (2013.01); *H01L 23/53223* (2013.01); *H01L 23/53238* (2013.01); *H01L 23/53266* (2013.01); *H01L 29/517* (2013.01); *H01L 2924/0002* (2013.01)

(58) Field of Classification Search
CPC .................. H01L 21/76879; H01L 23/5226

USPC ........................................... 438/675; 257/763
See application file for complete search history.

(56) References Cited

U.S. PATENT DOCUMENTS

| 6,358,842 B1* | 3/2002 | Zhou et al. ..................... 438/633 |
| 6,627,554 B1* | 9/2003 | Komada ........................ 438/710 |
| 6,756,672 B1* | 6/2004 | You et al. ....................... 257/751 |
| 7,713,865 B2* | 5/2010 | Gambino et al. .............. 438/637 |
| 2004/0033697 A1* | 2/2004 | Kumar et al. ................. 438/710 |
| 2007/0243708 A1 | 10/2007 | Hahn et al. |
| 2008/0136037 A1* | 6/2008 | Arakawa ....................... 257/773 |
| 2008/0150153 A1* | 6/2008 | Enquist ......................... 257/774 |
| 2010/0301491 A1* | 12/2010 | Yang ............................ 257/773 |
| 2011/0159690 A1* | 6/2011 | Chandrashekar et al. .... 438/675 |
| 2012/0070982 A1* | 3/2012 | Yu et al. ........................ 438/653 |

FOREIGN PATENT DOCUMENTS

JP 04-336422 11/1992

* cited by examiner

*Primary Examiner* — Christine Enad
(74) *Attorney, Agent, or Firm* — Slater & Matsil, L.L.P.

(57) ABSTRACT

Methods of forming conductive structures and the conductive structures are disclosed. A method includes forming an opening in a dielectric layer over a substrate, performing a cleaning process on the dielectric layer with the opening, forming a nucleation layer in the opening, etching the nucleation layer in the opening, and forming a conductive material in the opening and on the nucleation layer after the etching. An upper portion of the opening is distal from the substrate, and a lower portion of the opening is proximate the substrate. After the etching, a thickness of an upper portion of the nucleation layer in the upper portion of the opening is less than a thickness of a lower portion of the nucleation layer in the lower portion of the opening.

19 Claims, 2 Drawing Sheets

OPENING FILL PROCESS AND STRUCTURE FORMED THEREBY

BACKGROUND

Since the advent of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrinking the process node beyond the 20 nm node). As the demand for miniaturization continues, the further shrinking of the process node may increase the complexity of fabricating integrated circuits. The further shrinking of the technology node has decreased the processing window for various components. This decreased processing window may create problems in forming the components, which problems were previously not present.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
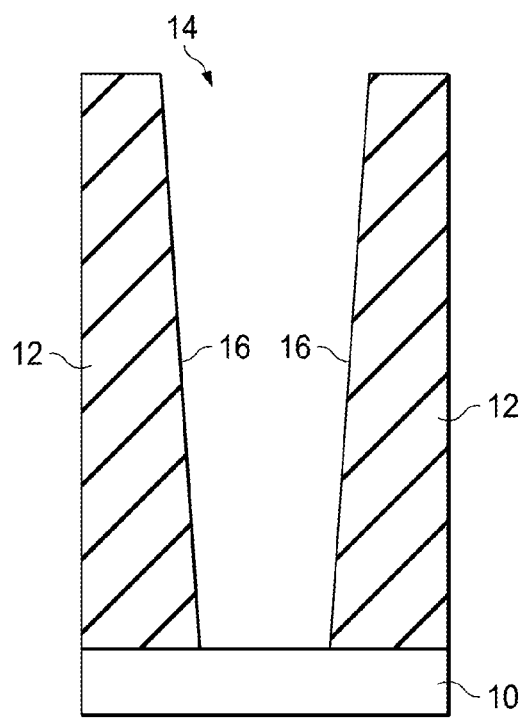
FIGS. 1 through 5 are various cross sectional views of intermediate structures during a process according to an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to specific contexts, namely a contact, plug, via, or other interconnect structure and methods of forming such. Another embodiment includes application to a gate last process and structure. Specific embodiments discussed herein may use tungsten for a conductive material for the gate structure, plug, etc., and other embodiments may use other conductive materials. Method embodiments may be discussed as being performed in a particular order, although other methods according to embodiments may be performed in any logical order. Like reference numerals throughout the figures refer to like components.

Figure 4:
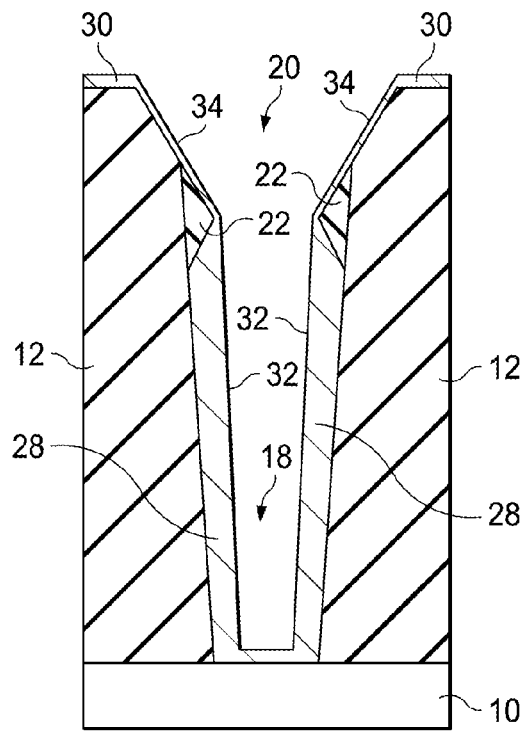
Figure 5:
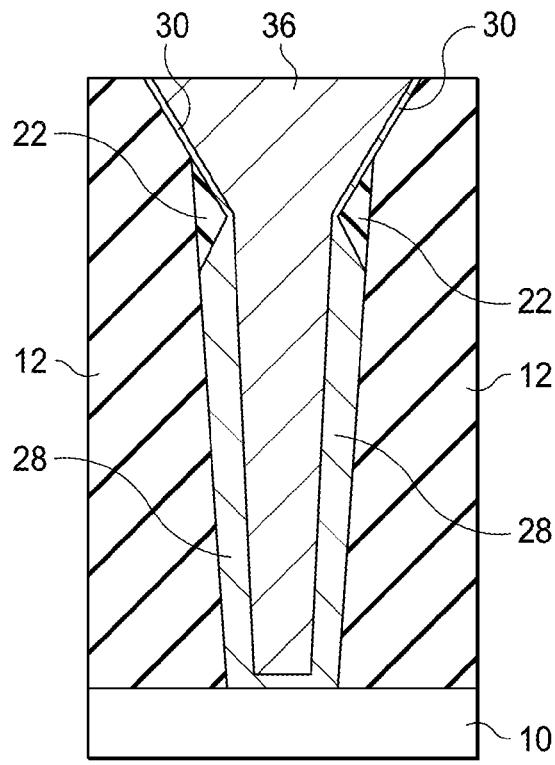
Figure 6:
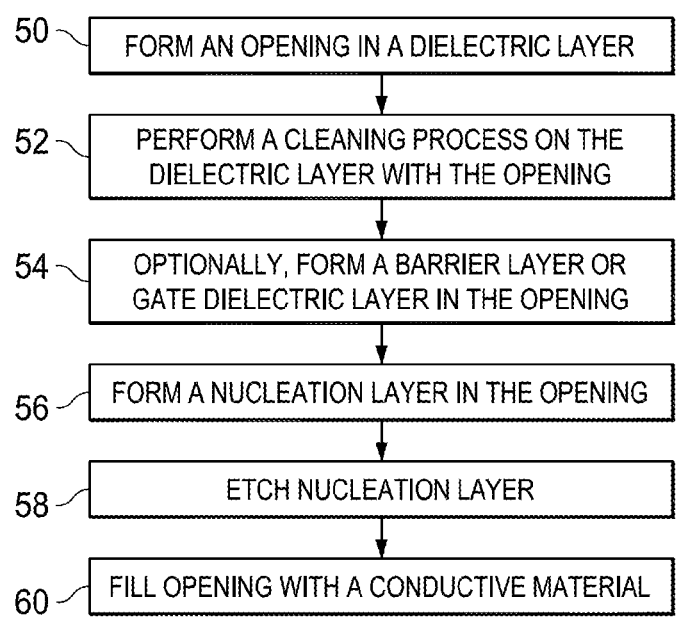
FIG. 6 is a flow chart of a process according to an embodiment.

FIGS. 1 through 5 illustrate various cross sectional views of intermediate structures during processing, and FIG. 6 is a flow chart of a process. The process in FIG. 6 will be discussed in context with FIGS. 1 through 5.

FIG. 1 illustrates an opening 14 that is formed in a dielectric layer 12 on a substrate 10 (see step 50, FIG. 6). The substrate 10 may include a bulk semiconductor substrate, a semiconductor-on-insulator substrate, or the like. Semiconductor materials that may be used in the substrate 10 include silicon, germanium, carbon, group III, group IV, and group V elements, and/or a combination thereof, such as silicon germanium, silicon carbon, and/or III-V compound semiconductor materials. Integrated circuit devices, such as transistors, may be formed in and/or on the substrate 10. Further, the substrate 10 may include one or more dielectric layers.

A dielectric layer 12 is over the substrate 10. The dielectric layer 12 may be one or more dielectric layers. In an example, the dielectric layer 12 includes an etch stop layer over the substrate 10 and an inter-layer dielectric (ILD) over the etch stop layer. In such example, the etch stop layer may be formed of SiN, SiCN, SiCO, CN, a combinations thereof, or the like, deposited by chemical vapor deposition (CVD), plasma-enhanced CVD (PECVD) techniques, the like, or a combination thereof. Further in such example, the ILD layer may be formed of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, formed by any suitable method, such as CVD, PECVD, spinning, the like, or a combination thereof. The etch stop layer is formed of a dielectric material having a different etch selectivity from adjacent layers, e.g., the underlying substrate 10 and the overlying ILD layer. The etch stop layer and the ILD layer may each comprise a plurality of dielectric layers and/or materials. Further, other embodiments contemplate that the dielectric layer 12 is an inter-metal dielectric (IMD), which may also include an underlying etch stop layer. The IMD and an etch stop layer may be formed of the same or similar materials as discussed with respect to the ILD and a corresponding etch stop layer, and using the same or similar processes. Additionally, for a metal gate last application, the dielectric layer 12 may comprise gate spacers such that sidewalls of the gate spacers define at least in part the opening 14.

The dielectric layer 12 is etched to form the opening 14 in an embodiment. The opening 14 may be for a contact, a plug, a via, or other interconnect structure. In another embodiment, a dummy gate is removed by an etch to form the opening 14 for a metal gate application. The etch is, for example, any suitable etch process, such as a reactive ion etch (RIE), inductively coupled plasma (ICP) etch, capacitively coupled plasma (CCP), sputter etch, the like, or a combination thereof.

The opening 14 is defined by opposing sidewalls 16 of the dielectric layer 12. The opposing sidewalls 16 are depicted as slightly angled from a plane perpendicular to the top surface of the substrate 10 and/or the top surface of the dielectric layer 12. The opposing sidewalls 16 may be substantially perpendicular to the top surface of the substrate 10 and/or the top surface of the dielectric layer 12. A distance between the opposing sidewalls 16 in a plane parallel to the top surface of the substrate 10 and/or the top surface of the dielectric layer 12 does not decrease as the opening 14 is traversed from the top surface of the substrate 10 to the top surface of the dielectric layer 12. For ease of discussion of only the embodiments herein, reference to a distance between opposing sidewalls 16 or other components on the opposing sidewalls 16 will be understood to be a distance in a plane parallel to the top surface of the substrate 10 and/or the top surface of the dielectric layer 12.

Figure 2:
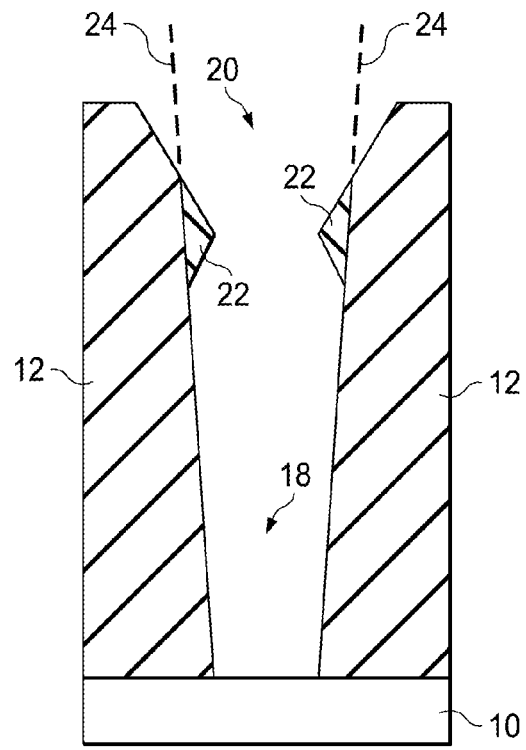

After the etch, the substrate 10 and dielectric layer 12 with the opening 14 undergo a cleaning process (step 52). An example cleaning process is an argon (Ar) plasma process, and other acceptable cleaning processes may be used. In an embodiment, as a result of the cleaning process, cleaning induced byproduct re-deposition portions 22 are formed on the opposing sidewalls 16 of the dielectric layer 12. For ease of discussion, after the cleaning process, the opening 14 has an opening lower portion 18 and an opening upper portion 20. The byproduct portions 22 may be disposed on the opposing sidewalls 16 between the opening upper portion 20 and the opening lower portion 18. Further, a distance between the opposing sidewalls 16 of the dielectric layer 12 in the opening upper portion 20 may be increased by the cleaning process. FIG. 2 illustrates the position of the opposing sidewalls 16 before the cleaning process by dashed lines 24. The byproduct portions 22 constrict the opening 14. For example, a distance between the opposing sidewalls 16 does not decrease as the opening 14 is traversed away from the top surface of the substrate 10 in the opening lower portion 18. Then, the byproduct portions 22 cause a distance therebetween to decrease as the opening 14 continues to be traversed. Further, a distance between the opposing sidewalls 16 begins to not decrease as the opening 14 is traversed in the opening upper portion 20 (e.g., beyond the byproduct portions 22). The portion of the opening 14 where the byproduct portions 22 are positioned may be referred to as a necking portion of the opening 14.

In an example application for a contact or plug, the opening 14 may be formed to an active area in the substrate 10, such as a source/drain region of a transistor in the substrate 10, which may further include a silicide. Although not depicted, a thin barrier layer may be conformally deposited in the opening 14 (step 54). The barrier layer may comprise titanium, titanium nitride, tantalum, tantalum nitride, manganese, manganese oxide, cobalt, cobalt oxide, cobalt nitride, the like, or a combination thereof and may be formed by CVD, physical vapor deposition (PVD), PECVD, atomic layer deposition (ALD), the like, or a combination thereof.

In an example application for a metal gate, the opening 14 may be formed to a channel region in the substrate 10. Although not depicted, a thin gate dielectric layer may be conformally deposited in the opening 14 (step 54). The gate dielectric layer may comprise silicon oxide, silicon nitride, the like, or a combination thereof, or may comprise a high-k dielectric material, such as a material that has a k value greater than about 7.0, for example, a metal oxide of Hf, Al, Zr, La, Mg, Ba, Ti, Pb, the like, or a combination thereof. The gate dielectric layer may be formed using molecular-beam deposition (MBD), ALD, PVD, the like, or a combination thereof.

Figure 3:
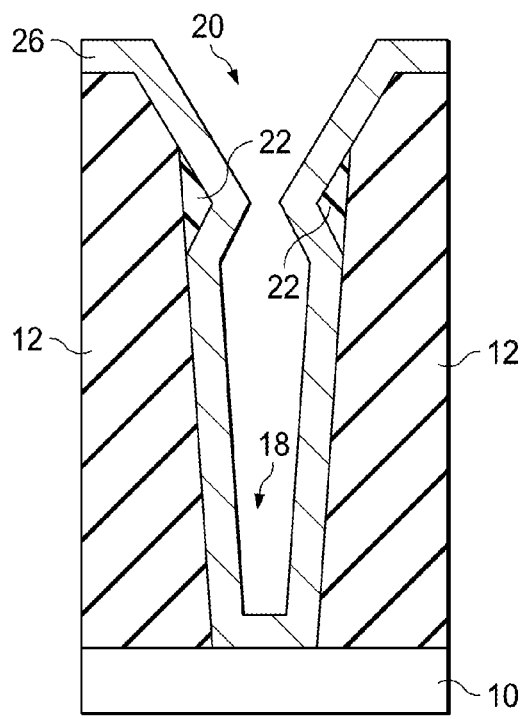

FIG. 3 illustrates a nucleation layer 26 formed in the opening 14 and on the top surface of the dielectric layer 12 (step 56). The nucleation layer 26 is depicted as being conformally deposited. For example, the nucleation layer 26 has a substantially uniform thickness throughout, where the thickness of a portion is in a direction orthogonal to the surface on which that portion is formed. In an embodiment, the nucleation layer 26 is tungsten (W) deposited by an ALD process. In this embodiment, the nucleation layer 26 may be formed by the ALD process using 3 to 11 cycles where a cycle is between 1 second and 10 seconds, a tungsten hexafluoride ($WF_6$) precursor flow rate of 10 to 500 sccm, a diborane ($B_2H_6$) precursor flow rate of 10 to 500 sccm, a pressure between 5 torr and 90 torr, and a temperature between 250° C. and 400° C. In another embodiment, the nucleation layer 26 may be any acceptable material, and may be formed by any acceptable process.

FIG. 4 illustrates the nucleation layer 26 after an etching process (step 58). For ease of discussion, the nucleation layer 26 comprises nucleation lower portions 28 in the opening lower portion 18 and nucleation upper portions 30 in the opening upper portion 20 and on the top surface of the dielectric layer 12. In an embodiment, the etching process is an anisotropic etch by RIE using a power between 200 W and 900 W, a temperature between 20° C. and 100° C., a gas flow rate of nitrogen trifluoride ($NF_3$) between 10 sccm and 50 sccm, and a pressure between 0.1 torr and 10 torr. In another embodiment, the etching process may be any suitable anisotropic etch, such as ICP etch, CCP etch, sputter etch, the like, or a combination thereof.

As a result of the etching process, portions of the nucleation layer 26 having a surface exposed to the etchant gas in a direction substantially orthogonal to the top surface of the substrate 10 and/or to the top surface of the dielectric layer 12 will be etched and/or thinned. As an example, nucleation upper portions 30 have significant exposed surface area and are significantly etched, whereas nucleation lower portions 28 may not have significant exposed surface area depending on the extent to which byproduct portions 22 protrude into the opening 14 and may not be significantly etched. Hence, nucleation lower portions 28 may have a greater thickness than nucleation upper portions 30. Using an embodiment described, a nucleation layer was deposited with a thickness of 43.77 Å in a lower portion of an opening, a thickness of 44.68 Å proximate the most constricted portion of a byproduct portion, and a thickness of 45.79 Å on the top surface of the dielectric layer. After the etching, the thicknesses were 41.56 Å, 23.24 Å, and 16.15 Å, respectively.

Also as a result of the etching process, opposing sidewalls of the nucleation layer 26 can be formed such that a distance therebetween does not decrease as the opening 14 is traversed from the top surface of the substrate 10 to the top surface of the dielectric layer 12. As shown in FIG. 4, opposing sidewalls 32 of the nucleation lower portions 28 have a distance therebetween that increases as the opening 14 is traversed away from the top surface of the substrate 10. Similarly, opposing sidewalls 34 of the nucleation upper portions 30 have a distance therebetween that increases as the opening 14 is traversed away from the top surface of the substrate 10.

FIG. 5 shows a conductive material 36 filling the remaining portions of the opening 14 (step 60). The conductive material 36 and the nucleation layer 26 (e.g., nucleation lower portions 28 and nucleation upper portions 30) may form a contact, plug, via, or other interconnect structure in the dielectric layer 12 according to an embodiment. In another embodiment, the conductive material 36 and the nucleation layer 26 (e.g., nucleation lower portions 28 and nucleation upper portions 30) may form a gate electrode of a gate structure.

In an embodiment, the conductive material 36 is tungsten (W) deposited by a CVD process. The CVD process may result in a differential deposition rate of the tungsten. For example, areas in which the nucleation layer 26 is thicker may have a higher deposition rate than areas in which the nucleation layer 26 is thinner. In an embodiment, the tungsten deposition rate may be greater in the opening lower portion 18 where the nucleation lower portions 28 are thicker than in the opening upper portion 20 where the nucleation upper portions 30 are thinner. In experiments, it was found that the deposition rate of the tungsten was slightly over 4 Å/s on a surface of the nucleation layer that was not etched, that the deposition rate was approximately 3.75 4 Å/s on a surface of the nucleation layer that experienced a 0.5 s etch, and that the deposition rate was approximately 1.1 Å/s on a surface of the nucleation layer that experienced a 1.5 s etch. Hence, there was approximately a 4 times deposition rate difference between a surface that was not etched and a surface that was etched for 1.5 s.

In another embodiment, the conductive material 36 may be tungsten (W), cobalt (Co), copper (Cu), aluminum (Al), nickel (Ni), titanium (Ti), gold (Au), the like, or a combination thereof, and may be formed by CVD, PVD, the like, or a combination thereof. In an embodiment, the conductive material 36 comprises or consists essentially of the same material as the nucleation layer 26, and in another embodiment, the conductive material 36 comprises or consists essentially of a different material from the nucleation layer 26. A planarization process, such as a chemical mechanical polish (CMP), may be used to remove any excess conductive material 36 and/or nucleation layer 26 and to planarize top surfaces of the conductive material 36, nucleation layer 26, and dielectric layer 12.

A person having ordinary skill in the art will readily understand that one or more layers, such as a dielectric layer like an IMD and/or etch stop layer, may be formed over the dielectric layer 12 and the contact, plug, via, other interconnect structure, or gate structure therein. Such a layer(s) may comprise devices and/or further interconnect structures. For example, a via in an IMD may directly couple the contact, plug, via, other interconnect structure or gate electrode in the dielectric layer 12.

An embodiment may avoid having a void or seam formed in the conductive material 36, such as for smaller technology nodes, for example, 15 nm, 12 nm, and smaller. By having opposing sidewalls 32 and 34 as depicted and described above, a pinch-off effect may be avoided during the deposition of the conductive material 36 that could otherwise form a void or seam in the contact, plug, via, or other interconnect structure that is formed. A void may refer to an instance where at least 70% of, e.g., the contact is unfilled, and a seam may refer to an instance where at least 30% of, e.g., the contact is unfilled. Further, a differential deposition may allow a lower portion of an opening to fill faster than an upper portion of the opening to help avoid a void or seam. In tests, a described embodiment achieved a reduction in the number of voids and seams in an array of contacts for 15 nm and 12 nm technology nodes. In those tests, no seams or voids were discovered in the array of contacts. By reducing the number of voids and seams for those technology nodes, device performance and yield may be increased.

An embodiment is a method. The method includes forming an opening in a dielectric layer over a substrate, performing a cleaning process on the dielectric layer with the opening, forming a nucleation layer in the opening, etching the nucleation layer in the opening, and forming a conductive material in the opening and on the nucleation layer after the etching. An upper portion of the opening is distal from the substrate, and a lower portion of the opening is proximate the substrate. After the etching, a thickness of an upper portion of the nucleation layer in the upper portion of the opening is less than a thickness of a lower portion of the nucleation layer in the lower portion of the opening.

Another embodiment is a method. The method includes forming an opening a dielectric material over a substrate and cleaning the dielectric material having the opening. Byproduct portions are formed on respective opposing sidewalls of the dielectric material in the opening by the cleaning. A nucleation layer is formed in the opening, and the nucleation layer is formed on the byproduct portions. Portions of the nucleation layer near the byproduct portions are removed, and after the removing, a distance between opposing interior sidewalls of the nucleation layer does not decrease as the opening is traversed from a bottom surface of the opening proximate the substrate to a plane of an upper surface of the dielectric material. A conductive material is formed in the opening and on the nucleation layer.

A further embodiment is a structure. The structure includes a dielectric material having an opening, byproduct portions on respective opposing sidewalls of the dielectric material in the opening, a nucleation layer in the opening and on the byproduct portions, and a conductive material on the nucleation layer and disposed in the opening. The dielectric material is over a substrate. The byproduct portions form a necking region in the opening. A distance between inner opposing sidewalls of the nucleation layer does not decrease as the opening is traversed from a surface of the opening proximate the substrate to a plane of a surface of the dielectric material distal from the substrate.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming an opening in a dielectric layer over a substrate, an upper portion of the opening being distal from the substrate, a lower portion of the opening being proximate the substrate;
    performing a cleaning process on the dielectric layer with the opening, after the cleaning process, a byproduct portion being on a sidewall of the opening, the byproduct portion forming a necking portion in the opening disposed between the upper portion of the opening and the lower portion of the opening;
    forming a nucleation layer in the opening and on the byproduct portion;
    etching the nucleation layer in the opening, wherein after the etching, a thickness of an upper portion of the nucleation layer in the upper portion of the opening is less than a thickness of a lower portion of the nucleation layer in the lower portion of the opening; and
    forming a conductive material in the opening and on the nucleation layer after the etching.

2. The method of claim 1, wherein after the cleaning process, a distance between opposing sidewalls in the opening decreases in a necking portion of the opening as the opening is traversed in a direction from the lower portion of the opening to the upper portion of the opening.

3. The method of claim 1, wherein the forming the nucleation layer comprises conformally forming the nucleation layer in the opening.

4. The method of claim 1, wherein the etching the nucleation layer is an anisotropic etch.

5. The method of claim 1, wherein after the etching the nucleation layer, a distance between opposing interior sidewalls of the nucleation layer does not decrease as the opening is traversed from a bottom surface defining the opening to a plane of a top surface of the dielectric layer.

6. The method of claim 1, wherein a formation rate of the conductive material in the lower portion of the opening is greater than a formation rate of the conductive material in the upper portion of the opening during the forming the conductive material.

7. The method of claim 1, wherein the nucleation layer comprises tungsten, and the conductive material comprises tungsten.

8. The method of claim 1, wherein the forming the nucleation layer comprises using an atomic layer deposition (ALD) process, and the forming the conductive material comprises using a chemical vapor deposition (CVD) process.

9. A method comprising:
  forming an opening in a dielectric material over a substrate;
  cleaning the dielectric material having the opening, byproduct portions being formed on respective opposing sidewalls of the dielectric material in the opening by the cleaning;
  forming a nucleation layer in the opening, the nucleation layer being formed on and contacting the byproduct portions;
  removing portions of the nucleation layer in the opening and near the byproduct portions, after the removing, a distance between opposing interior sidewalls of the nucleation layer does not decrease as the opening is traversed from a bottom surface of the opening proximate the substrate to a plane of an upper surface of the dielectric material; and
  forming a conductive material in the opening and on the nucleation layer.

10. The method of claim 9, wherein the cleaning comprises using an argon (Ar) plasma process.

11. The method of claim 9, wherein the forming the nucleation layer comprises a conformal deposition of the nucleation layer.

12. The method of claim 9, wherein the removing the portions of the nucleation layer comprises using an anisotropic etch process.

13. The method of claim 9, wherein the opening has an upper portion and a lower portion, the lower portion of the opening being near the substrate, the upper portion of the opening being away from the substrate, the byproduct portions being disposed in respective regions between the upper portion of the opening and the lower portion of the opening, the nucleation layer in the lower portion of the opening being thicker than the nucleation layer in the upper portion of the opening after the removing the portions of the nucleation layer.

14. The method of claim 9, wherein the forming the conductive material comprises a differential deposition process.

15. A method comprising:
  forming a dielectric material over a substrate;
  forming an opening in the dielectric material, byproduct portions from the forming being on respective opposing sidewalls of the dielectric material in the opening, the byproduct portions forming a necking region in the opening;
  forming a nucleation layer in the opening and on the byproduct portions, a distance between inner opposing sidewalls of the nucleation layer not decreasing as the opening is traversed from a surface of the opening proximate the substrate to a plane of a surface of the dielectric material distal from the substrate; and
  forming a conductive material on the nucleation layer and disposed in the opening.

16. The method of claim 15, wherein a first portion of the nucleation layer distal from the substrate has a first thickness, and a second portion of the nucleation layer proximate the substrate has a second thickness, the first thickness being less than the second thickness.

17. The method of claim 16, wherein the first portion of the nucleation layer is in a first region of the opening, and the second portion of the nucleation layer is in a second region of the opening, the necking region in the opening being disposed between the first region of the opening and the second region of the opening.

18. The method of claim 15, where no void and no seam is in the conductive material in the opening.

19. The method of claim 15, wherein the nucleation layer comprises tungsten, and the conductive material comprises tungsten.

* * * * *